(12) United States Patent
Brodsky

(10) Patent No.: US 7,278,853 B1
(45) Date of Patent: Oct. 9, 2007

(54) POWER CARD CONNECTION STRUCTURE

(75) Inventor: William L. Brodsky, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/425,171

(22) Filed: Jun. 20, 2006

(51) Int. Cl.
*H01R 12/00* (2006.01)
(52) U.S. Cl. ............... 439/60; 439/885; 439/289
(58) Field of Classification Search ........... 439/885, 439/60–62, 289
See application file for complete search history.

(56) References Cited

U.S. PATENT DOCUMENTS

| | | | | |
|---|---|---|---|---|
| 4,655,517 A | * | 4/1987 | Bryce | 439/83 |
| 5,733,148 A | * | 3/1998 | Kaplan et al. | 439/680 |
| 2002/0131243 A1 | | 9/2002 | Harrison et al. | 361/728 |
| 2002/0172022 A1 | | 11/2002 | DiBene, II et al. | 361/761 |
| 2003/0156400 A1 | | 8/2003 | Dibene, II et al. | 361/803 |
| 2003/0181075 A1 | | 9/2003 | Hartke et al. | 439/67 |
| 2005/0035463 A1 | | 2/2005 | Kathman et al. | 257/777 |
| 2005/0093120 A1 | | 5/2005 | Millik et al. | 257/678 |

\* cited by examiner

*Primary Examiner*—Truc Nguyen
(74) *Attorney, Agent, or Firm*—Lily Neff, Esq.; Lawrence D. Cutter, Esq.; Heslin Rothenberg Farley & Mesiti P.C.

(57) ABSTRACT

Electrically conductive L-shaped blades are disposed in an insulative body as a mechanism for mechanically and electrically connecting circuit cards to circuit boards. In particular, the interconnection device herein provides a mechanism for providing greater thermal and electrical properties for connections from voltage regulator modules to high current conducting planes within a printed wire board while at the same time increasing the available bulk material cross-sectional area available for current flow.

10 Claims, 4 Drawing Sheets

POWER CARD CONNECTION STRUCTURE

TECHNICAL FIELD

The present invention is generally directed to power supply cards and is more particularly directed to power supply systems used in high end data processing systems. Even more particularly, the present invention is directed to a connection structure for mounting voltage regulator modules (VRMs) on a printed wire board (PWB).

BACKGROUND OF THE INVENTION

For uses contemplated by the present invention, power delivery solutions use multiple VRMs (voltage regulator modules) mounted on a Printed Wire Board to construct a Direct Current Adapter (DCA) which is capable of providing multiple voltage and current levels. Both the VRMs and the PWB include multiple layers of electrical circuit patterns. The connection of the VRMs to the PWB also requires a low resistance connection capable of carrying a substantial current level. For example, in one embodiment of the present invention a PWB which is about 2" by 5" by 14" carries a current of 1,400 amperes, enough to power seven conventional U.S. homes. In addition to high total current demands for the PWB and likewise for any given VRM within the DCA, there is also a requirement that current flowing into the PWB from one edge of the PWB passes through to the other edge for output connections with as little electrical resistance loss as possible since at these high current levels $I^2R$ heating losses not only produce a loss in efficiency but also needlessly heat the VRMs and other electronic PWB components. Accordingly, there is a need for current to pass from one side of the PWB to the other side with as little resistive loss as possible. However, there is a corresponding need for the VRMs to be configured in a plurality of rows in which each VRM card is vertically mounted. Each one of these rows requires its own set of connections to a conductive layer in the PWB. This connection takes room that interferes with the objective of reducing $I^2R$ losses in the PWB. Accordingly, this means that when current provided from one row of VRMs, in its transit to the other side of the PWB for purposes of external connection, passes by the footprint of a VRM in an adjacent row, the current must pass through a less than desirable conductor cross sectional area. It is therefore seen that these requirements necessitate a connection system that carries substantial current but which is spatially configured to provide a better current carrying path within the PWB.

SUMMARY OF THE INVENTION

The shortcomings of the prior art are overcome and additional advantages are provided through the provision o an electrical assembly which comprises a printed wire board having at least one conductive plane which extends from one side of the board to another side of the board. At least one circuit card is disposed vertically with respect to the board. An interconnection device connecting these two structures includes a plurality of electrically conductive L-shaped blades disposed within an insulative body. The blades provide electrical connections between the circuit card and the conductive plane, with one end of said L-shaped blade in contact with the card and with the other end of the L-shaped blade in contact with the board.

In accordance with another aspect of the present invention, a device for providing electrical connections between a circuit board and a vertically mounted circuit card comprises a plurality of electrically conductive L-shaped blades disposed in an insulative body.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
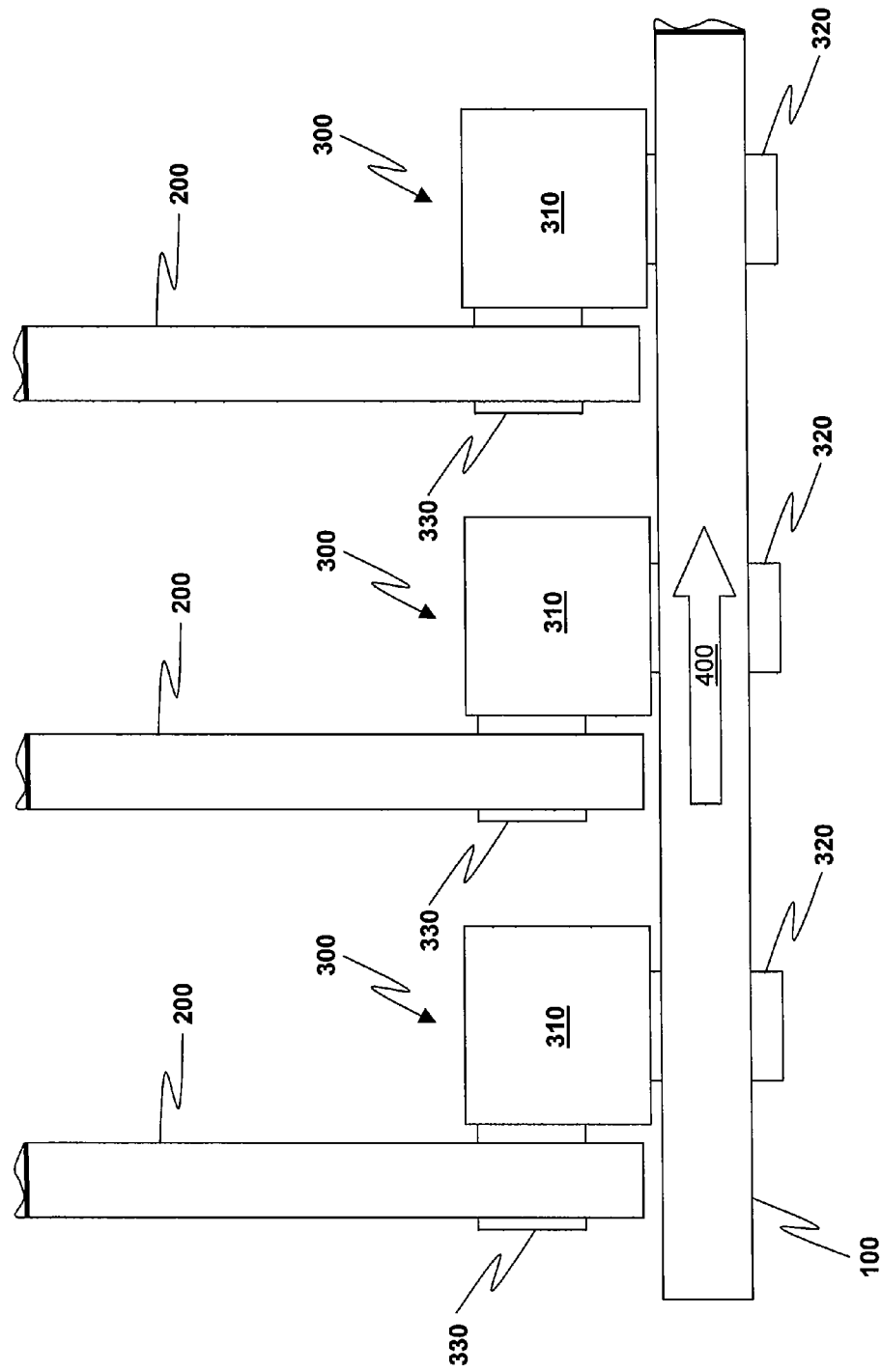
FIG. 1 is a side elevation view, in accordance with the present invention, which illustrates the placement and configuration of multiple rows of VRMs on a PWB.

FIG. 1 illustrates one embodiment of the present invention and in particular, there is shown Printed Wire Board 100 on which is mounted a plurality of Voltage Regulator Modules in the form of vertically disposed cards 200. Each VRM card 200 visible in FIG. 1 represents a row of similarly disposed cards. Both cards 200 and board 100 contain internal layers of conductors for interconnection purposes. Cards 200 are electrically and mechanically attached to board 100 through a series of L-shaped blades having portions 320 and 330 which extend through board 100 and card 200 respectively. These L-shaped blades are disposed within an insulative body 310. The L-shaped blades and insulative body 310 are provided as a single unitary structure 300 which is shown in more detail in FIG. 2.

However, before going on to discuss this structure in detail, it is also worth noting the presence of current flow arrow 400 with PWB 100. In general, this arrow represents the direction of current flow in the Direct Current Adapter shown. This arrow is provided to suggest the current flow in any one of several conductive layers present in board 100. It is also worth pointing out that the power system discussed herein is a direct current system. The large currents flowing from one edge of board 100 to an opposite edge flow through the bulk of the conductive layers present in board 100. Unlike AC systems, the so-called skin effect is not applicable to these conductive elements. Since, as discussed above, the conductive layers in board 100 carry significant levels of current from one side of board 100 to the other, it is important that their cross-sectional area be as large as possible. This means that these layers should have as few penetrations as possible since each penetration for providing electrical connections can reduce the cross-sectional bearing area as seen by the flow of current as suggested by arrow 400. Furthermore, each penetration should provide the least obstruction to this current flow in terms of not reducing the cross-sectional area. Even more, the interconnection provided should be compatible with the following design constraints: (1) both board 100 and cards 200 have internal conductive layers; (2) the application is a high current one; (3) resistive losses are to be kept to a minimum; (3) large contact areas and surfaces for interconnection are desired; (4) the cards are to be mounted vertically; and (5) current flowing from one edge of the card to the other must travel past the footprint on the board presented by the next row of cards. This "footprint" includes conductor penetrations and connections needed for that row of VRM cards.

Figure 2:
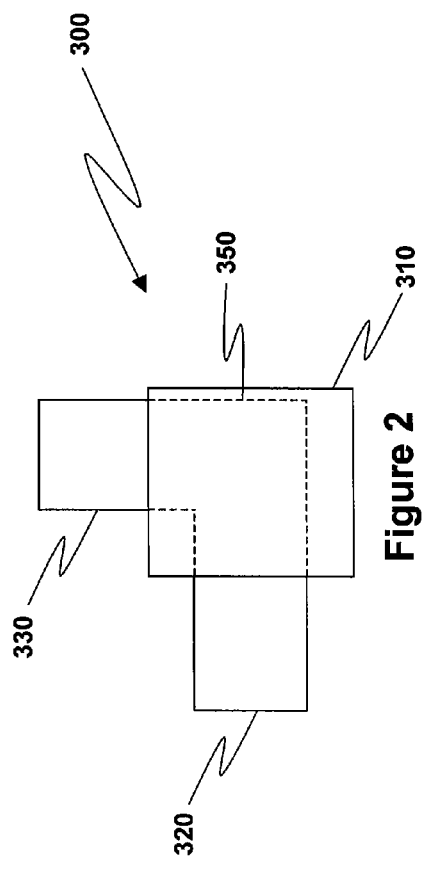
FIG. 2 is an end view of an elongated set of L-shaped blades mounted in an insulative body to provide connections between VRMs and a PWB.
Figure 3:
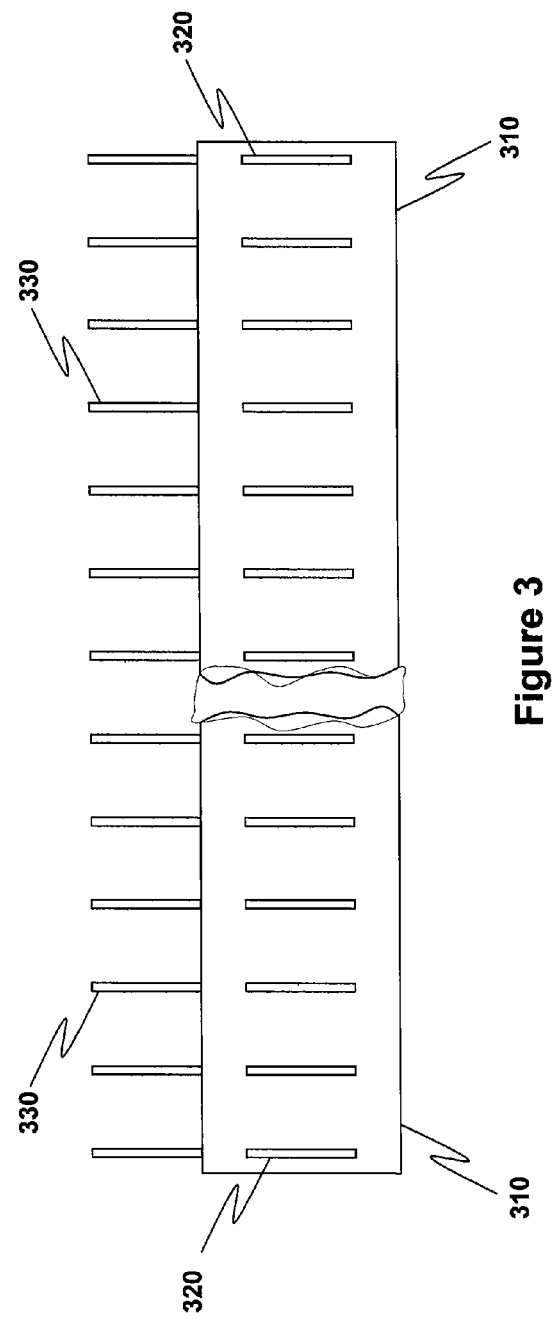
FIG. 3 is a side levitation view of the connector configuration shown in FIG. 2.

The problems discussed herein are solved through the use of an interconnection and mounting device such as that shown in FIGS. 2 and 3. FIG. 2 shows an end view and FIG. 3 shows a side view. The mounting device comprises a plurality of L-shaped blades 350 having portion 330 which connects to a conductive layer (or layers, if necessary) in card 200 and also having portion 320 which connects to a conductive layer or layers 110 in board 100. L-shaped blades 350 are disposed within insulative body 310. Blade portions 330 and 320 extend from adjacent surfaces of insulative body 310. Device 300 may be provided in a plurality of lengths to accommodate designs which include various numbers of VRMs. The insulative body of device 300 may also be provided in an easily breakable form so that one part number (and thus one device model) may be manufactured while providing flexibility sufficient to accommodate any number of VRMs.

Figure 4:
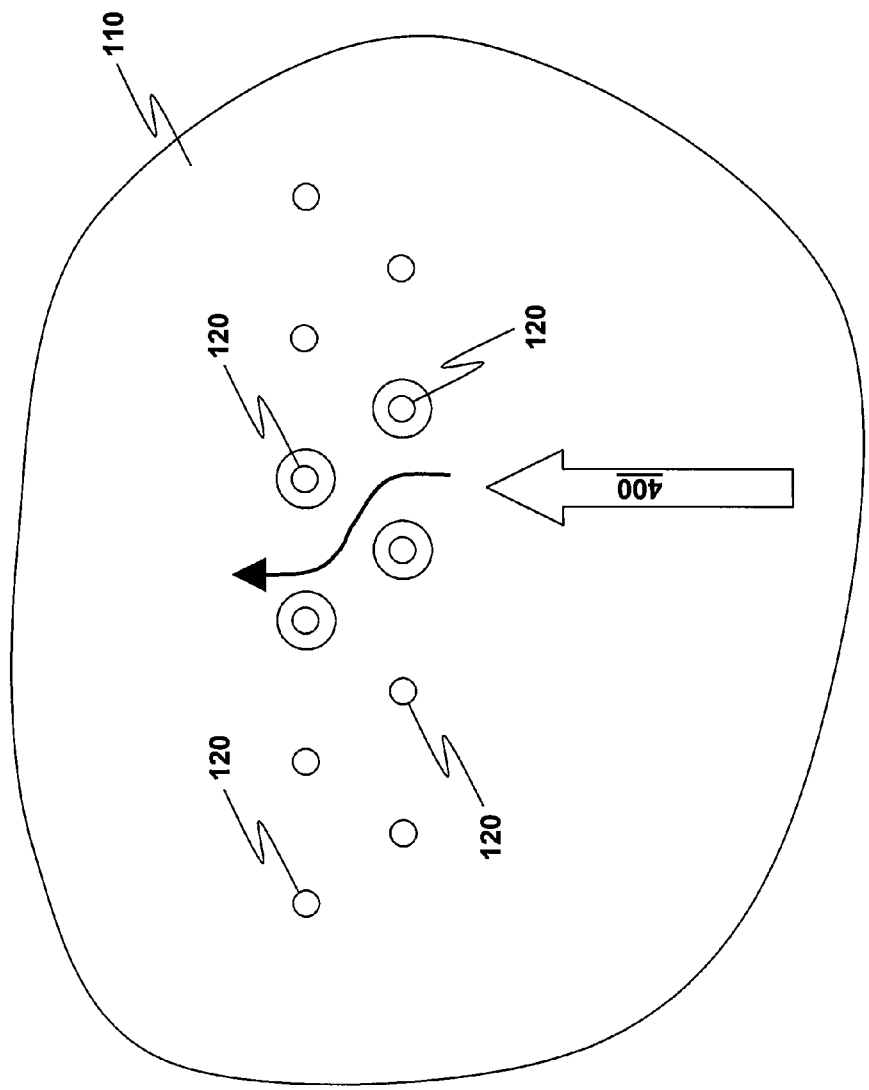
FIG. 4 is a top view illustrating the conventionally employed method for attaching and connecting VRMs to a PWB.
Figure 5:
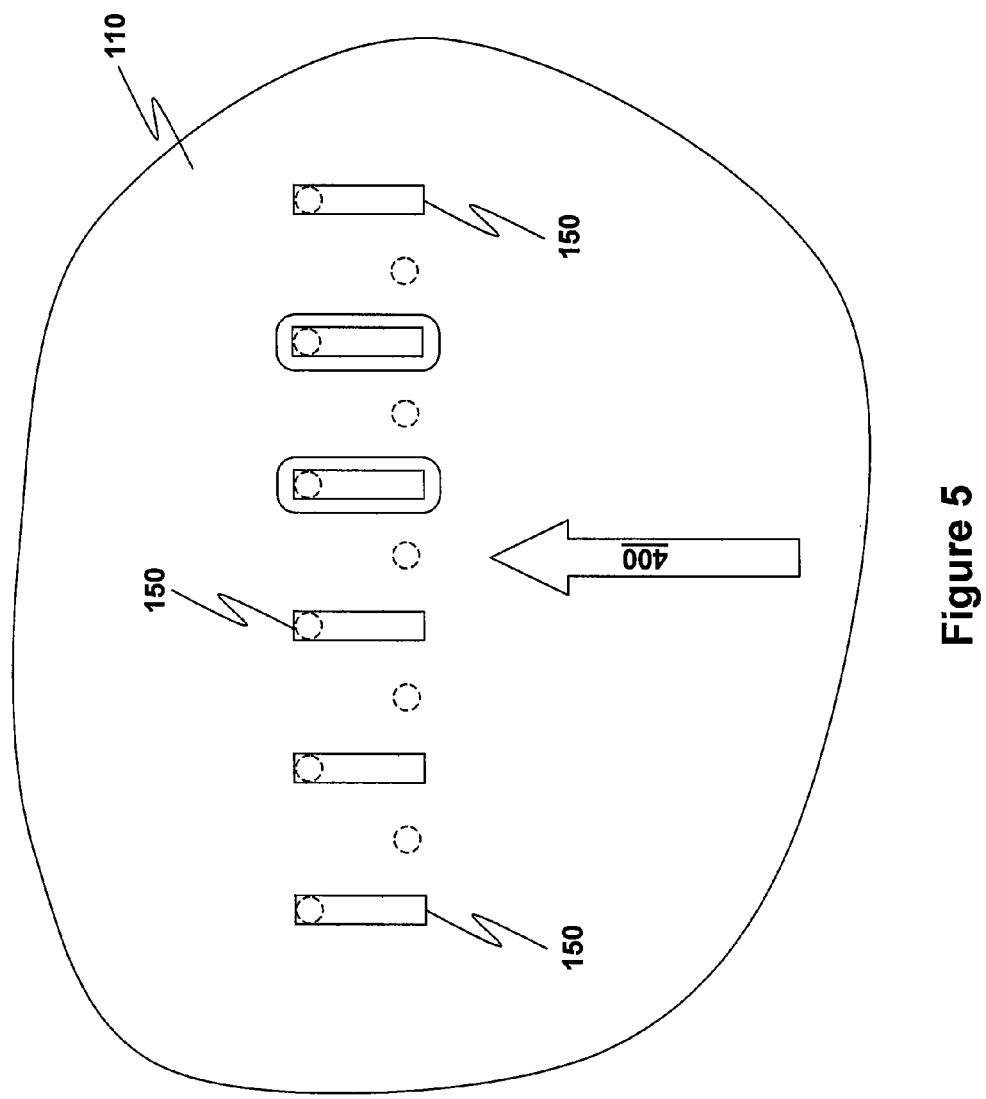
FIG. 5 is a view illustrating the improvement in cross-sectional area provided by the bladed attachment configuration of the present invention.

The advantages of the present invention are best appreciated when considering an alternative design such as that shown in FIG. 4. This Figure shows conductive layer 110 in board 100 penetrated by a plurality of openings 120 for a plane of a different voltage bias, that is, the present VRM is not connected to this plane but current from another VRM passes through it. Openings 120 are arranged in two staggered rows for pins having the same diameter as the blade thickness. However, they effectively decrease the cross-sectional area of conductive sheet 110 just as if they were disposed in a single row and increases the path length due to the staggered clearance hole regions. Furthermore, in terms of contact area, that area is determined by the circumference of the openings. The improvement provided by the bladed structure of the present invention is best seen in FIG. 5. For comparison sake only, openings 120 from FIG. 4 are shown in phantom view; they are not intended as features in FIG. 5. Importantly for the present invention, it is seen that slots 150 for blades 350 (more particularly for blade portions 320) provide two advantages: (1) a smaller reduction in the cross-sectional area of conductive layer 110; and (2) a greater contact area for connecting board conductors to card conductors. This greater contact area is shown by the greater length of the rectangular slot for the blade as opposed to the lengths of the two circular circumferences shown. Thus, in addition to providing a greater cross-section for current flow, the structure and device of the present invention provides greater contact for both electrical and thermal conductivity purposes. Thus we have two significant advances in that the attachment points from the VRM and/or PWB provide a low resistance connection member while presenting a low constriction resistance for the electrical current to: (1) minimize additional $I^2R$ heating; and (2) to provide a low thermal resistance from the connection to the PWB or VRM power planes. This reduces $I^2R$ heating losses and lowers temperature rise by increased blade cooling.

The present invention thus provides a series of vertically mounted high conductivity blades between the VRM and the PWB in a spaced manner allowing current to pass through the PWB in the foot print of the VRM as well as from a VRM to the PWB.

In the present invention an L-shaped blade of high conductivity material (such as copper or a copper alloy) is assembled into a insulative body (such as a thermally resistant plastic) so that the blades are positioned in a predetermined spacing. The insulative body is preferably fabricated in a break-away manner so that the length of the connection member is easily modified by breaking the insulator member to a predetermined length. This is suggested by the breakaway portion of device 300 as shown in FIG. 3. The break in the device, as shown in FIG. 3, is meant to suggest one of two things: (1) that portions of the device are not visibly present so as to suggest that its length is a matter of design choice; and (2) to also suggest that the device may be cut, sliced or broken at various points to accommodate different numbers of VRMs. The insulative body may also be configured to provide mounting support from the DCA PWB to the VRM with snap lock, screws, glue, etc. Such fastenings are conventional and are not shown. Having vertically positioned blades 350 allows for a relatively low bulk resistance in the blades proper as well as an increased connection area from the blade to PWB or VRM power planes. Increasing the blade to power plane area reduces the connection constriction resistance and increases thermal conductivity of the connection. Both of these attributes lower the temperature rise of the VRM to PWB connection which allows a higher current carrying capacity for the connection.

While the discussions above have been couched in terms of attaching voltage regulator modules to a printed wire board, the structures and methods provided herein are equally applicable in any situation in which high current levels are present in a printed wire board and there is a need to have this current flow past the footprint of other components that are in its path. Accordingly, the practices of the present invention are applicable in almost any high current card to board scenario.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An electrical assembly comprising:
   a printed wire board having at least one conductive planar sheet extending from one side of said board to an opposite side of said board;
   at least two rows of electrical circuit cards disposed vertically with respect to said printed wire board;
   an interconnection device, for each row of said circuit cards, said device including at least one electrically conductive L-shaped blade disposed within an insulative body, with said L-shaped blade providing electrical connection between its corresponding circuit card and said at least one conductive planar sheet within said printed wire board, with one end of said L-shaped blade being in electrical contact with its corresponding circuit card and with the other end of said L-shaped blade being in electrical contact with said at least one conductive planar sheet of said circuit board.

2. The assembly of claim 1 in which said electrical circuit card is a voltage regulator module.

3. The assembly of claim 1 in which said assembly comprises a direct current adapter.

4. The assembly of claim 1 in which there are a plurality of electrical circuit cards arranged in a row and in which there are a plurality of said L-shaped blades, said blades being oriented parallel to one another and providing electrical connection between said electrical circuit cards and said printed wire board.

5. The assembly of claim 1 in which a said at least one conductive planar sheet within said printed wire board connects electrical circuit cards along one edge of said board to an opposite edge of said printed wire board and any layer within said printed wire board above said planar sheet is penetrated with slotted openings substantially corresponding in shape to an end of said L-shaped blades.

6. The assembly of claim 1 in which said insulative body is frangible, whereby different lengths may be provided.

7. The assembly of claim 1 in which said blades are made of a material selected from the group consisting of copper and copper alloys.

8. The assembly of claim 1 in which said insulative body is plastic.

9. The assembly of claim 1 in which said insulative body is substantially in the shape of a rectangular parallelepiped.

10. The assembly of claim 5 in which said openings are provided for connection to cards in another row.

* * * * *